US007315992B2

(12) United States Patent
Bhooshan et al.

(10) Patent No.: US 7,315,992 B2
(45) Date of Patent: Jan. 1, 2008

(54) ELECTRO-MIGRATION (EM) AND VOLTAGE (IR) DROP ANALYSIS OF INTEGRATED CIRCUIT (IC) DESIGNS

(75) Inventors: Rishi Bhooshan, Bangalore (IN); Sampath Kuve, Bangalore (IN); Venugopal Puvvada, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 245 days.

(21) Appl. No.: 10/710,693

(22) Filed: Jul. 29, 2004

(65) Prior Publication Data

US 2006/0026540 A1  Feb. 2, 2006

(51) Int. Cl.
G06F 17/50 (2006.01)

(52) U.S. Cl. .................. 716/5; 716/9; 716/10
(58) Field of Classification Search .......... 716/5, 716/9, 10
See application file for complete search history.

(56) References Cited

U.S. PATENT DOCUMENTS

| 5,404,310 | A | * | 4/1995 | Mitsuhashi | 716/13 |
|---|---|---|---|---|---|
| 5,461,579 | A | * | 10/1995 | Misheloff et al. | 716/5 |
| 5,757,679 | A | * | 5/1998 | Sawai et al. | 716/4 |
| 6,038,383 | A | * | 3/2000 | Young et al. | 716/5 |
| 6,102,962 | A | * | 8/2000 | Sugasawara et al. | 716/5 |
| 6,219,630 | B1 | * | 4/2001 | Yonezawa et al. | 703/14 |
| 6,286,127 | B1 | * | 9/2001 | King et al. | 716/8 |
| 6,330,526 | B1 | * | 12/2001 | Yasuda | 703/2 |
| 6,405,160 | B1 | * | 6/2002 | Djaja et al. | 703/24 |
| 6,405,354 | B1 | * | 6/2002 | Itazu et al. | 716/8 |
| 6,591,402 | B1 | * | 7/2003 | Chandra et al. | 716/5 |
| 6,598,214 | B2 | * | 7/2003 | Chatterjee et al. | 716/10 |
| 6,629,301 | B1 | * | 9/2003 | Sutherland et al. | 716/8 |
| 6,631,506 | B1 | * | 10/2003 | Pie et al. | 716/4 |
| 6,637,018 | B1 | * | 10/2003 | Demler | 716/18 |
| 6,662,344 | B2 | * | 12/2003 | Tamaki et al. | 716/1 |
| 6,735,558 | B1 | * | 5/2004 | Yamaguchi | 703/14 |
| 6,748,572 | B2 | * | 6/2004 | Fujine | 716/5 |
| 6,757,873 | B2 | * | 6/2004 | Yamaguchi | 716/2 |
| 6,874,132 | B1 | * | 3/2005 | Bhamidipaty | 716/1 |
| 6,880,139 | B2 | * | 4/2005 | Mau et al. | 716/4 |
| 6,909,330 | B2 | * | 6/2005 | Colleran et al. | 331/8 |
| 6,928,626 | B1 | * | 8/2005 | McGaughy et al. | 716/1 |
| 6,941,258 | B2 | * | 9/2005 | Van Heijningen et al. | 703/16 |
| 6,954,921 | B2 | * | 10/2005 | Hassibi et al. | 716/18 |
| 7,039,572 | B1 | * | 5/2006 | Narahara et al. | 703/14 |
| 7,043,705 | B2 | * | 5/2006 | Somayaji et al. | 716/5 |

(Continued)

FOREIGN PATENT DOCUMENTS

JP   2000-057186   *   2/2000

Primary Examiner—Phallaka Kik
(74) Attorney, Agent, or Firm—Alan K. Stewart; W. James Brady; Frederick J. Telecky, Jr.

(57) ABSTRACT

Performing approximate analysis of modules based on corresponding layout files while requiring fewer computations than performing a transistor level simulation of a design of a module or integrated circuit. One feature enables IR/voltage drop and EM (electro migration) violations to be determined. Another features improves such analysis in case of memory modules. One more feature enables determination of whether sufficient voltages will be applied to program efuses in a module containing the efuses. Yet another feature enables the signal characteristics of an output path/pin to be determined to check for any EM violations.

24 Claims, 8 Drawing Sheets

U.S. PATENT DOCUMENTS

| | | | |
|---|---|---|---|
| 7,080,341 B2* | 7/2006 | Eisenstadt et al. | 716/13 |
| 7,089,525 B2* | 8/2006 | Tamaki et al. | 716/12 |
| 2001/0049815 A1* | 12/2001 | Shinomiya et al. | 716/11 |
| 2002/0011885 A1* | 1/2002 | Ogawa et al. | 327/158 |
| 2002/0083399 A1* | 6/2002 | Chatterjee et al. | 716/1 |
| 2002/0199160 A1* | 12/2002 | Fujine | 716/5 |
| 2004/0015787 A1* | 1/2004 | Heydler et al. | 716/1 |
| 2004/0098681 A1* | 5/2004 | Yamaguchi | 716/4 |
| 2004/0168136 A1* | 8/2004 | Mau et al. | 716/4 |
| 2004/0172609 A1* | 9/2004 | Hassibi et al. | 716/18 |
| 2004/0230408 A1* | 11/2004 | Colleran et al. | 703/2 |
| 2004/0261044 A1* | 12/2004 | Yonezawa | 716/4 |
| 2005/0050495 A1* | 3/2005 | McGuffin et al. | 716/5 |
| 2005/0081172 A1* | 4/2005 | Jung | 716/8 |
| 2005/0216873 A1* | 9/2005 | Singh et al. | 716/5 |
| 2005/0278662 A1* | 12/2005 | Kartschoke et al. | 716/4 |
| 2006/0031795 A1* | 2/2006 | Rahmat et al. | 716/5 |

* cited by examiner

ELECTRO-MIGRATION (EM) AND VOLTAGE (IR) DROP ANALYSIS OF INTEGRATED CIRCUIT (IC) DESIGNS

BACKGROUND OF INVENTION

1. Field of the Invention

The present invention relates to computer aided design (CAD) of integrated circuits, and more specifically to a method and apparatus for determining electro_migration (EM) and/or voltage (IR) drop in integrated circuit designs.

2. Related Art

The designs of integrated circuits (ICs) are often represented in digital format, and analyzed for conformance with various requirements. Typically, designs are analyzed prior to fabrication of corresponding integrated circuits. By ensuring that the design conforms to various requirements prior to fabrication, unneeded time delays and cost overruns may be avoided, as is well known in the relevant arts.

One of the tasks in such circuit design analysis is electro-migration (EM) migration. EM generally refers to dislodging of ions from a metal wire (connecting nodes in an IC), and is caused by current density (current flow divided by width of the metal) exceeding a corresponding threshold. EM impedes the ability of metal to conduct, in addition to leading to reduced life-time. Accordingly, it is generally desirable to ensure that current density not exceed a desired threshold at least for a substantial amount. Thus, it may be desirable to ensure that an IC design be analyzed for EM migration.

Another task of interest in circuit design analysis is voltage drop analysis. Voltage (or IR) drop generally refers to a difference of a voltage level from a supply voltage (e.g., Vdd) at a node of interest and is usually caused by the resistance (either due to parasitic resistance or due to other components in the path) present between a voltage source (providing the supply voltage) and the node of interest.

As a result, circuit component(s) which are connected to nodes (other than the supply voltage nodes) may receive a terminal voltage, which is lesser than the supply voltage. If the terminal voltage is lesser than a corresponding permissible threshold, the circuit components may not operate in an desired manner. For example, a circuit may become non-operational or operate at a lower frequency (compared to a desired optimal frequency). Accordingly, it may be desirable to perform voltage drop analysis to ensure that various nodes of interest receive at least corresponding threshold voltages.

Analysis of circuit designs needs to be performed while taking into account various considerations. In general, it is desirable that various tasks be performed with at least some desired level of accuracy without consuming substantial time (or number of computations).

BRIEF DESCRIPTION OF DRAWINGS

Various features of the present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Overview

An aspect of the present invention enables approximate current flowing through each path/component and a voltage drop at each node of an integrated circuit (IC) to be determined without requiring substantial computational resources (time) in situations when a higher/block level design of the IC is unavailable Such a feature may be attained by examining an IC design to extract the topology including the transistors, resistors and the interconnections in the module. The approximate current flowing through each transistor may be determined by appropriate computations. The IR/voltage drop at each node of interest and current flow on each path may then be determined by performing a simulation. The determined values may be used to ensure that the design is in conformance with various EM and voltage drop requirements.

In one embodiment, an approximation of the amount of current flowing through each transistor is determined by replacing (for purpose of analysis) each transistor with a current source, with the magnitude of the current (source) being proportional to the width of the transistors and connecting the transistors in parallel. The distribution of current due to such an assumption approximately represents the current distribution when the transistors are connected according to the circuit design.

Due to such an approach, the EM and IR analysis may be performed approximately without requiring substantial computational resources when the higher/block level design of a portion of an IC is unavailable (for example, because it is provided by a third party using some custom design techniques). The model of the module thus developed may be used in a circuit level analysis as well.

Another aspect of the present inventionthe accuracy of analysis and/or minimizes computations, when analyzing memory modules based on a recognition that only a few (typically one) memory rows are accessed at a given time. Only a subset (e.g, top, middle, bottom) of the rows of the memory may be considered (to be present) while analyzing the circuit for IR drop and EM violations according to the approach described above.

In one embodiment, three separate iterations may be performed corresponding to the top, bottom and middle rows, and conclusions (of potential violations) may be based on the iteration providing the worst results (i.e., occurrence of violations) computation time may be reduced (at the expense of compromising some degree of accuracy) by considering all three rows in a single iteration.

One more aspect of the present invention enables analysis to be performed on an integrated circuit containing modules with several efuses. An efuse generally refers to a component which can be programmed after fabrication to a desired logical value. Typically, if unblown, the fuse is deemed to be at one logical value and in another logical value otherwise. An aspect of the present invention enables analysis to be performed to ensure that sufficient voltage can be applied to program each efuse to a desired value.

Such an analysis may be logically viewed as being performed in two stages. In a first stage, a eFuse cell ("WCR cell") offering a worst case resistance (WCR) (i.e., maximum resistance) between the two supply voltages (e.g., Vpp and Vss) is determined in each module containing eFuse cells. In the second stage, a chip level analysis is performed replacing each such module with the corresponding WCR cell to determine whether sufficient voltage can be applied across each WCR eFuse cell. A module is deemed to be acceptable if sufficient voltage can be applied across the corresponding WCR cell. The two stages are described below in further detail.

With reference to the first stage, each efuse cell in a module is replaced by a current source of known magnitude. The resulting circuit is analyzed (e.g., using simulation) to determine a efuse cell in the path offering the WCR. The module (of corresponding efuse) may be rejected (as being unacceptable) if the WCR exceeds a pre-specified threshold.

With respect to the second stage in which chip-level analysis is performed, the entire module may be replaced by the determined path/eFuse corresponding to the WCR. The resistance of the path from a pre-determined point (e.g., a pin) of the chip to each WCR efuse may be determined by replacing efuse cells with a current source of known magnitude. Also, a drop in the voltage (compared to voltage provided at pre-determined points, for example, supply points at chip level) at each WCR efuse cell may be computed by replacing each WCR efuse cell by a current source (Isense) whose magnitude is determined by the process technology (used to fabricate the eFuse module) and other technological considerations.

A module may be rejected if the thus computed resistance or voltage drop to the WCR efuse representing the module violates corresponding threshold values. Representing a number of efuses (in each module) by a WCR eFuse minimizes the number of simulations resulting in reduction of computational resources.

Another aspect of the present invention enables determination of approximate current levels (density) on an output path of a module. In an embodiment, the transistors connected to the output path are first determined. A library of pre_characterized cells are searched to determine the transistor whose width matches the width of the transistor connected to the output path/pin. The transistor is deemed to operate with the same drive characteristics of the pre-characterized cell containing a matching transistor (with closest width), and characteristics of the current on the output path are determined based on such drive characteristics. Accordingly, various parameters such as peak/average/RMS current density may be approximately determined.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well_known structures or operations are not shown in detail to avoid obscuring the invention.

II. Example Environment

Figure 1A:
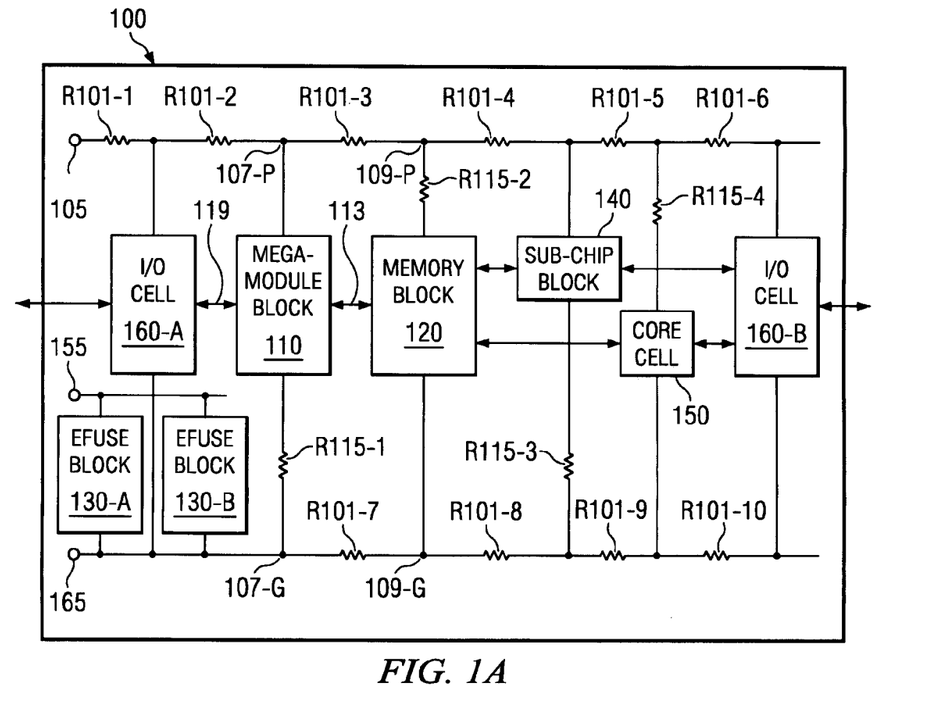
FIG. 1A is a block diagram depicting several example modules contained in an integrated circuit in one embodiment.

FIG. 1A is a block diagram depicting several example modules contained in integrated circuit 100 in one embodiment. For ease of understanding, IC 100 is shown containing only few modules, however, IC 100 may contain a number of such modules, other types modules and many other components as well. IC 100 is shown containing megamodule 110, memory block 120, efuse blocks 130-A and 130-B, sub-chip 140, core-cell 150, resistors 101-1 through 101-10 and 115-1 through 115-4, and I/O cells 160-A and 160-B. Each block is described in detail below.

Resistors 101-1 through 101-10 and 115-1 through 115-4 representing the routing resistance of the path (metal) portions connecting each block/cell/sub-chip to the supply and ground voltages. Merely for illustration, only some of the resistors are shown in the Figure, though each path portion would typically offer a corresponding resistance. All such resistors (along with the connections) together are often referred to as the resistance network.

I/O cells 160-A and 160-B are used to send/receive various signals. Core cell 150 (e.g., AND gates, multiplexors) and sub-chip block 140 (complex circuit) may implement various desired tasks in conjunction with other modules. I/O cells, core cells and sub-chip block represent example portions of the overall integrated circuit, for which the high level (i.e., cells, gates, etc.) design as well as low level design is available. Due to the availability of the high level designs, various commercially available tools may be used for EM/voltage drop analysis.

Megamodule 110, memory module 120 and efuse blocks 130-A and 130-B represent example modules for which high level design is not available. In an embodiment, the design of each module is represented in the form of a layout file, which can be sent for fabrication. The manner in which such modules can be analyzed is described in sections below.

Each of megamodule 110 and memory module 120 is a shown connected between positive power supply rail (connected to Vdd at node 105) and negative power supply rail (connected to Vss at node 165). The power to each module is derived from Vdd and a closed path for the current (proportional to power) flowing through the module is provided externally by connecting the corresponding nodes (of the components in each module) to Vss.

Efuse blocks 130-A and 130-B represent example blocks containing arrays of efuse cells, which can be programmed to respective desired values. For illustration, it is assumed that the cells of efuse block 130-A need to be programmed to specify an identifier, and that efuse block 130-B represents a programmable ROM. Thus, the cells of 130-B may each represent a bit of the ROM, which need to be programmed to desired bit values. Efuse blocks 130-A and 130-B are connected between nodes 155 and 165 respectively representing positive supply (Vpp) and negative supply (Vss) nodes.

R101-1 through R101-6 respectively represent the parasitic resistance (measured by (R=ro*l/A, wherein resistivity (ro), length (l), and area of cross section (A)) offered by the positive power supply rail on the corresponding segments. Similar parasitic resistance may be present on other segments of the path as well, and are not shown in the Figure merely for conciseness. In addition, other components (e.g., resistors, also not shown) may be present in the path to various modules, which also add to the voltage drop to the corresponding modules.

The presence of such resistance causes a voltage drop to each node of interest, and it is desirable to ensure that the voltage drop is acceptable for the operation of various components. In addition, it may be desirable to ensure that the current density on each path is also acceptable. Such requirements represent example desired criteria, which can be ensured according to several aspects of the present invention.

In general, it is desirable that each of the components of integrated circuit 100 as well as the entire integrated circuit be analyzed for various criteria. Various features of the present invention enable such analysis to be performed. The broad approach in an embodiment is illustrated with reference to FIG. 1B.

Figure 1B:
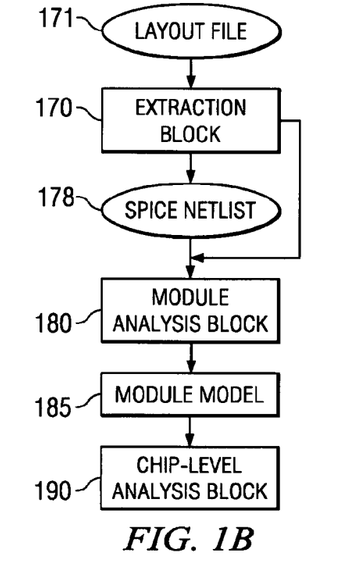
FIG. 1B is a block diagram illustrating a broad approach employed in an embodiment implementing several aspects of the present invention.

Extraction block 170 is shown receiving layout database 171 (data representing the design of an integrated circuit) and extracting SPICE netlist 178. The implementation of extraction block 170 depends on the representation of layout database 171, and commercially available tools (e.g., Layout Extraction tool available from K2 Technologies, Inc., IC Layout Verification Division, 7800 Banner Drive, MS3960, Dallas, Tex. 75251) can be used for such extraction.extraction rules may also be provided as inputs to facilitate the extraction operation.

Module analysis block 180 analyzes various modules according to the features of the present invention to determine whether any of the modules violates corresponding threshold requirements. Such analysis is performed with an acceptable level of accuracy and with an acceptable computational requirements. A simplified model of each module may be provided to simplify (reduce computations of) the chip level analysis. Module analysis block 180 may generate a module model (185), which is then used in a chip level analysis. Such models provide benefits such as reduction of computational resources, etc., as described below in further detail.

Chip analysis block 190 performs the chip level analysis of the modules together. Due to the simplified model of some of the modules, chip analysis block 190 may be implemented with a reduced number of computations, while providing an acceptable level of accuracy in analyzing the operation of the entire integrated circuit. The description is continued with respect to analysis of mega-module type circuit, for which high level design is unavailable.

III. Module for which Logical/High Level Design is not Available

III. A. General Introduction

There are often situations in which the high level design of portions (e.g., mega-module 110) an integrated circuit (IC) is not available. For example, a third party may design a complex portion of an overall IC, and merely provide a layout file (along with various parameters such as power consumption requirements), which gets integrated with the overall IC design.

Given the absence of high level design of such modules, analysis of the modules and the entire IC may provide several challenges. According to a prior approach, current flows (and thus EM analysis) and IR drops may be determined by performing transistor-level simulations. One problem with such a prior approach is that a substantially high computational resources are required to perform transistor-level simulation and the number of input vectors required to cover the functionality of the entire circuit may be high as well.

An aspect of the present invention enables such modules to be modeled substantially accurately without consuming substantial computational resources, as described below in further detail.

III. B. Analyzing a Module

Figure 2:
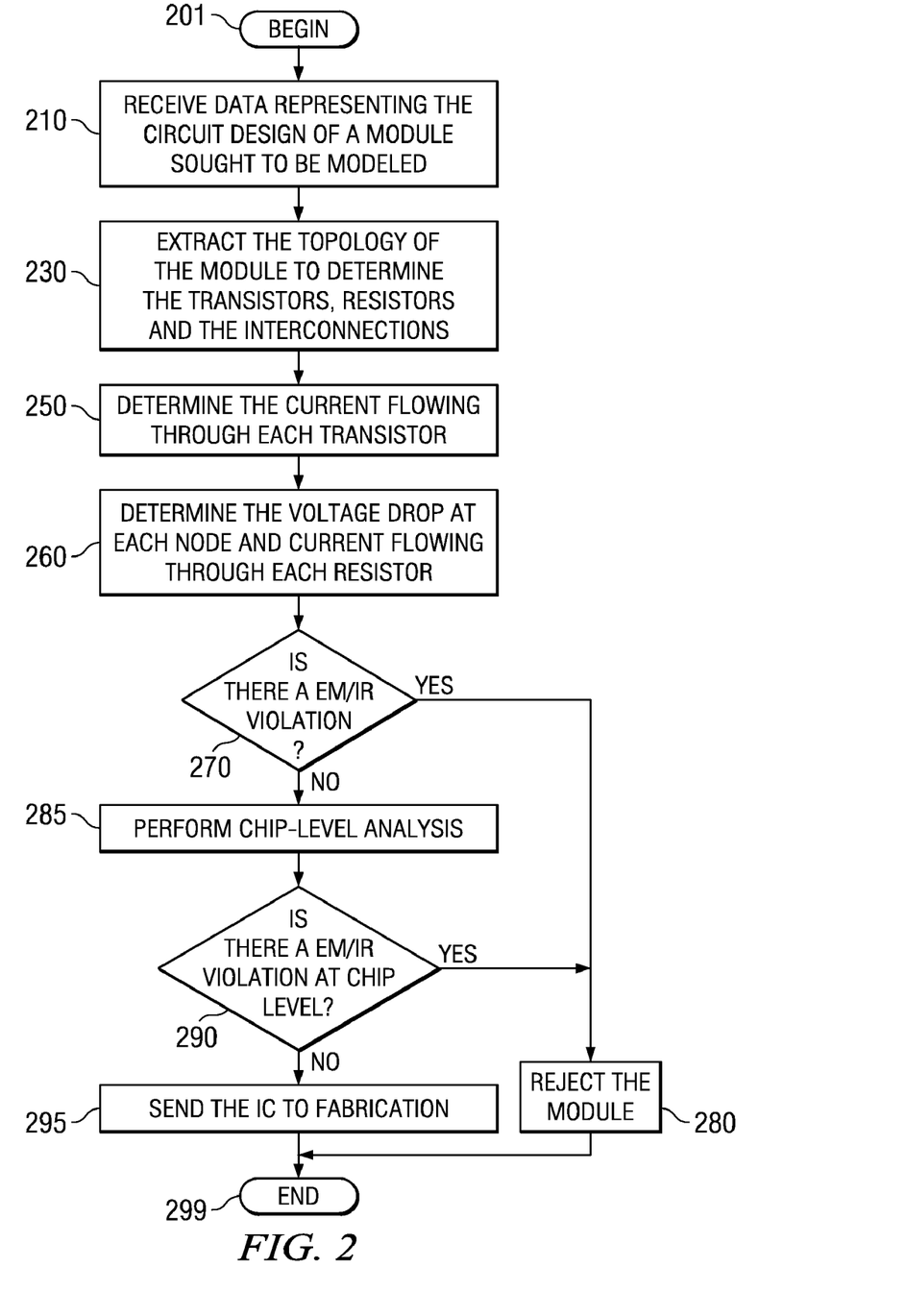
FIG. 2 is a flow-chart illustrating the manner in which a module may be analyzed for voltage/IR drop and electro migration (EM) violations according to an aspect of the present invention.

FIG. 2 is a flow-chart illustrating the manner in which a module may be analyzed according to an aspect of the present invention. For illustration, the flow-chart is described with reference to FIGS. 1A and 1B. The method begins in step 201, in which control immediately passes to step 210.

In step 210, data representing the circuit design of a module sought to be modeled may be received. In step 230, the topology of the module may be extracted to determine the transistors, resistors (including parasitic resistance, described above) and the interconnections. As a result, information representing nodes and the components (resistors, transistors, etc.) connected between nodes, may be generated.

The extraction operation generally depends on the format in which the circuit design is represented. In an embodiment, the data is received in a layout format (i.e., defining various masks which can be used during fabrication), and the data is examined to determine the topology. In an embodiment, extraction block 170 extracts the topology of the module from a layout file.

In step 250, the current flowing through each transistor may be determined. The manner in which such a determination can be made, is described in a section below.

In step 260, the voltage at each node and current through each path is determined (based on the current flowing through each transistor). Various well-known tools/techniques may be used for such a determination. In an embodiment, the voltage levels at each nodes are determined using SPICE simulation, and the current in each path are computed by dividing the voltage difference (of the either end of the path) by the resistance (of the path). The module may be logically divided into one portion connected to Vss and another portion connected to Vdd, and two simulations performed in parallel. The results of the two simulations may be combined to determine the effective voltage at each node.

In step 270, the current density of each path and the voltage drop at each node may be compared with respective threshold values to determine whether EM and/or IR drop violation has occurred. As is well known, the current density of a path may be computed by dividing the current flowing through a path with the width of the path. The width of each path may be determined based on the extraction tool used and various design considerations. The current levels computed in step 260 are then used to compute the current density.

Control passes to step 280 if violation is determined in step 270, and to step 285 otherwise. In step 280, the module may be rejected as EM (based on current density violation) and IR drop values are not within the corresponding maximum permissible threshold levels. Control passes to step 299, in which the method ends.

In step 285, chip_level (potentially entire IC) analysis is performed to determine the EM and IR drops again. The information (e.g., current flows) determined in step 260 may be used in providing an internal model for the module (megamodule 110).

In step 290, whether EM/IR drop values violate corresponding permissible threshold values at chip_level is determined. Control passes to step 280 if the determined values violate the threshold, and to step 295 otherwise. In step 295, the layout file of the IC may be sent for fabrication. Control passes to step 299 in which the method ends.

Thus, modules may be analyzed for EM/IR drop violations as described above. However, as noted in step 270 above, the current flowing through each transistor may need to be determined. An aspect of the present invention enables such current values to be determined approximately, as described below in further detail.

III. C. Determining Current Flowing Through Each Transistor

Figure 3:
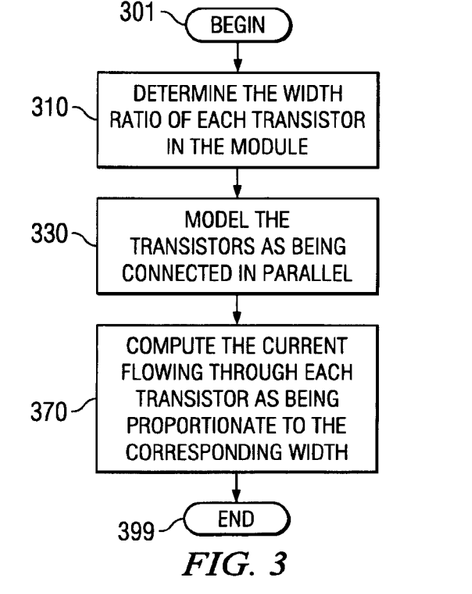
FIG. 3 is a flow-chart illustrating a method used to determine the approximate current flowing through each transistor of a module according to an aspect of the present invention.

FIG. 3 is a flow-chart illustrating the method used to determine the current flowing through each of the transistors according to an aspect of the present invention. For illustration, the flow-chart is described with reference to FIGS. 1 and 2. The method begins in step 301 in which control immediately passes to step 310.

In step 310, the width of each transistor in the module may be determined. In an embodiment, the width is determined using an extraction tool. In general, the determination depends on the manner in which the design of the module is represented.

In step 330, the transistors are modeled as being connected in parallel. In an embodiment, all the transistors of the module are modeled as current sources being connected in parallel. Such an approach approximately represents the current distribution in a realistic scenario.

In step 370, the current flowing through each transistor may be computed as being proportionate to the corresponding width. The aggregate current flowing through all the transistors may be determined based on the (current) specifications provided by a designer of the megamodule. Based on such aggregate value, the specific amount of current flowing through each transistor is computed as being proportionate to the corresponding width. The method ends in step 399.

Due to such modeling (steps 310 and 330), the computational resources and the time required to determine the current flowing through each transistor may be substantially reduced. Steps 330 and 370 of FIG. 3 are illustrated with reference to the details of an implementation of megamodule 110.

III. D. Example Megamodule

Figure 4:
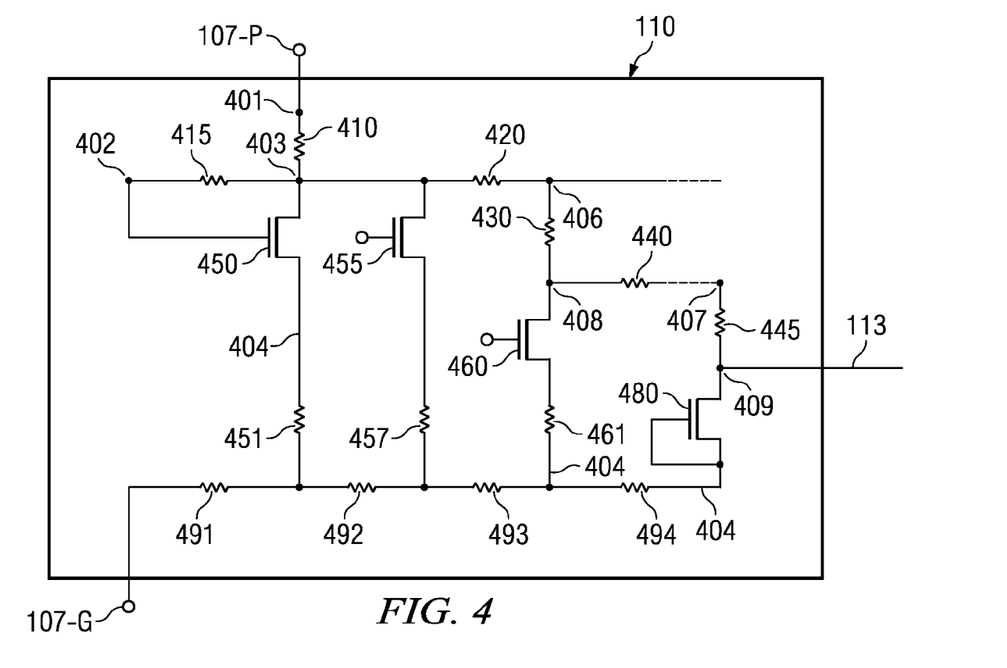
FIG. 4 is a circuit diagram illustrating the details of a portion of a megamodule in one embodiment.

FIG. 4 is a circuit diagram illustrating the details of a portion of megamodule 110. For illustration, megamodule 110 is shown containing only a few transistors and resistors, however, an actual implementation may contain substantially higher number of transistors and resistors forming a complex circuit. The circuit diagram is shown containing resistors 410, 415, 420, 430, 440, 445, 451, 457, 461, and 491-494 and transistors 450, 455, 460 and 480. Again, for simplicity, only representative components are shown. Each component is described below.

Drain terminals of transistors 450, 460 and 480 are respectively shown connected to nodes 403, 406 and 409 and source terminals are connected to node 404 (representing ground node). The gate terminals of transistors 450, 460 and 480 are respectively connected to nodes 402, 405 and 404. The gate terminal of transistor 455 is connected to node 403 via resistor 456. Transistors (450, 460 and 480), and resistors (R410, R415, R420, R430, R440 and R445) are connected in a defined manner to implement a circuit logic. The output is provided on path 113 connected to node 409.

The power required for the operation of megamodule 110 is derived by connecting megamodule 110 between nodes 107-P (connected to Vdd) and 107-G (connected to Vss). As a result, the current flows via R101-1 and R101-2 (causing a portion of the IR drop) before flowing through, for example, transistor 450. The drain voltage at node 403 (drop at node 107-P plus drop across R410) and current flowing through transistor 450 needs to satisfy the desired criteria.

Figure 5A:
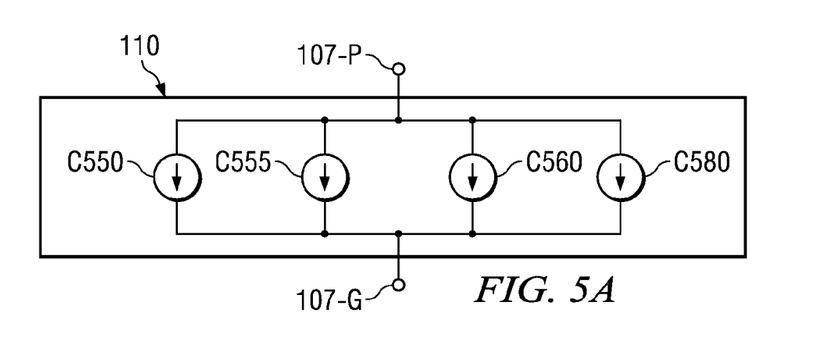
FIG. 5A is a circuit diagram illustrating the manner in which the circuit of FIG. 4A may be modeled to determine the approximate currents flowing through each of the transistors.

FIG. 5A is a circuit diagram illustrating the manner in which the circuit of FIG. 4 may be modeled to determine the approximate currents flowing through each of the transistors. The Figure is shown containing four current sources C550, C555, C560 and C580, respectively corresponding to transistors 450, 455, 460 and 480 (of FIG. 4). The current sources are shown connected in parallel, irrespective of the topology of the circuit design of mega-module 110.

The magnitude of current sources may be computed as follows, assuming that the widths of transistors 450, 455, 460 and 480 equal W450, W455, W460 and W480.

The relationship between Iavg and the widths of transistors 450, 455, 460 and 480 is as shown in Equation (1).

$$\text{Iavg} = i0 \times (W450 + W455 + W460 + W480) \quad \text{Equation (1)}$$

wherein i0 represents the proportionality current and Iavg represents the average current sunk by the entire module. Iavg may be determined by dividing power (P) provided to the module (provided by the design specifications) by the supply voltage (Vdd).

$$i0 = \text{Iavg}/(W450 + W455 + W460 + W480) \quad \text{Equation (2)}$$

The magnitude of the current sources C550, C555, C560 and C580 may be determined using Equations (3), (3A), (4), and (5) shown below.

$$C550 = i0 * W450 \quad \text{Equation (3)}$$
$$C555 = i0 * W455 \quad \text{Equation (3A)}$$
$$C460 = i0 * W460 \quad \text{Equation (4)}$$
$$C480 = i0 * W480 \quad \text{Equation (5)}$$

Figure 5B:
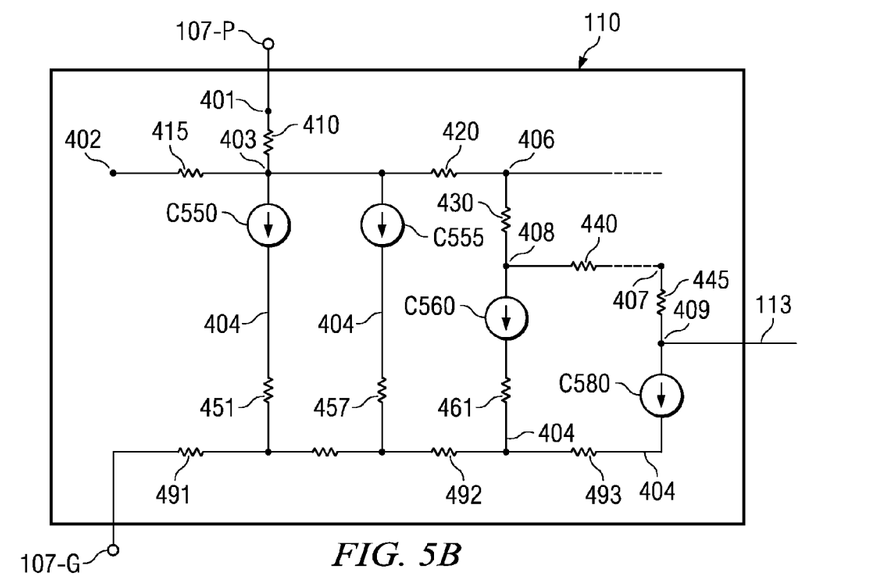
FIG. 5B is a circuit diagram that can be analyzed using various tools and techniques to determine the current flowing through each of the paths, as well as the voltage level at each node.

Once the magnitudes of the current sources are computed, for purpose of step 250, the transistors may be replaced by the current sources. The corresponding circuit is shown in FIG. 5B, with transistors 450, 455, 460 and 480 of FIG. 4 being replaced by current sources C550, C555, C560 and C580 respectively. The circuit model of FIG. 5B can be analyzed using various tools (e.g., SPICE tool, widely available in the market place) and techniques to determine the current flowing through each of the paths, as well as the voltage level at each node.

The approaches described above can be used to model various types of modules (e.g., for which only the layout file is available). However, the accuracy of results can be enhanced with respect to modeling of memory modules, as described below in further detail.

IV. Modeling Memory Modules

IV. A. General Introduction

The approaches described above with reference to FIGS. 2-5B can be applied to model memory module 120 as well. However, as may be readily appreciated, the current distribution need not be distributed equally (unlike in the approach of FIG. 5A) since only a single row of a memory is typically accessed. An aspect of the present invention takes advantage of such an observation to improve the accuracy of modeling memory modules, as described below.

IV. B. Example Memory Module

Figure 6:
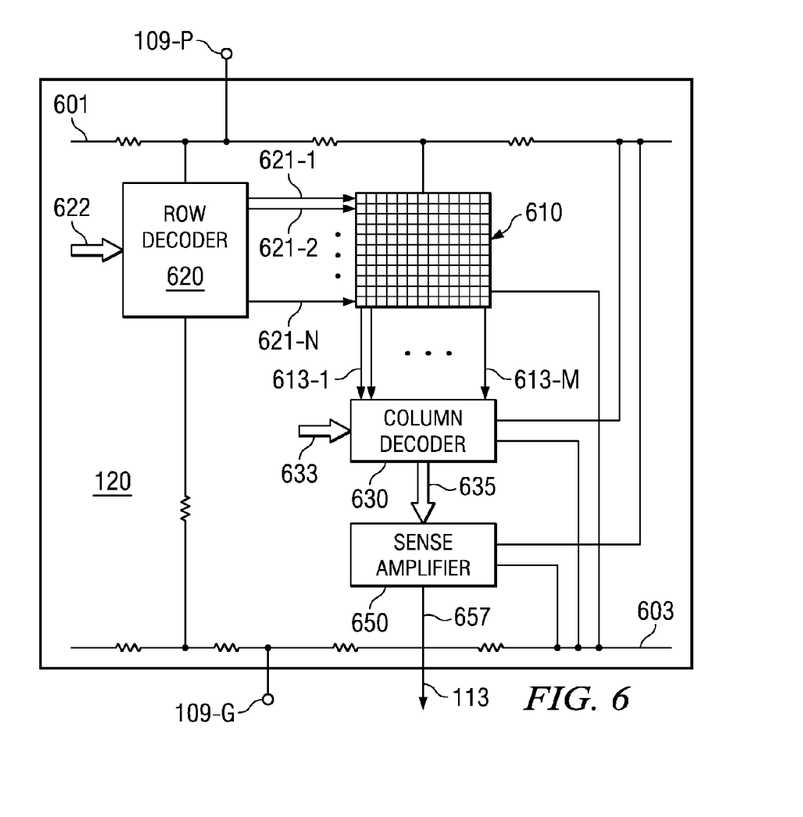
FIG. 6 is a block diagram illustrating the details of a memory module in one embodiment.

FIG. 6 is a block diagram of memory module 120 implemented in one embodiment. Memory module 120 is shown containing memory array 610, row decoder 620, column decoder 630 and sense amplifier 650. The memory module may contain other components such as pre-charge circuits (well known in the relevant arts), and are not shown for conciseness. Each block is described briefly below.

Array 610 contains bit cells organized in the form of multiple rows (N) and columns (M). Each cell is implemented using one or more transistors, which together store a bit value. Buses 601 and 603 contains multiple metal wires, with each wire providing supply voltage to corresponding columns of cells. For illustration, only some resistors 602-1 through 602-7 representing resistance offered by such metal wires are shown. Accordingly, the resistance/voltage drop/current to each cell may be different. Only one of the rows of memory array 610 is selected by the decoding logic.

Row decoder 620 determines the specific row ('active' row) of data accessed in array 610 according to a row address received on bus 622, and accordingly generates row decode signal 621. The row of bits corresponding to the selected row are provided on a bus formed by lines 613-1 through 613-M.

Column decoder 630 determines the specific bit (within the accessed row) to select the specific bit of interest (on bit line 635) from the row of bits. The specific bit is determined by a column address received on path 633. Both the row and the column address together form an access address for array 610. Sense amplifier 650 senses the signal level on path 633 to determine whether the accessed bit represents a 0 or 1.

Each of the components of memory module 120 is implemented using one or more of resistors, capacitors, transistors, etc. It is desirable that memory module 120 be analyzed to ensure there are no EM violations in the paths and IR drop violations at various nodes. The manner in which memory modules may be modeled is described below in further detail.

IV. D. Method of Modeling a Memory Module

Figure 7:
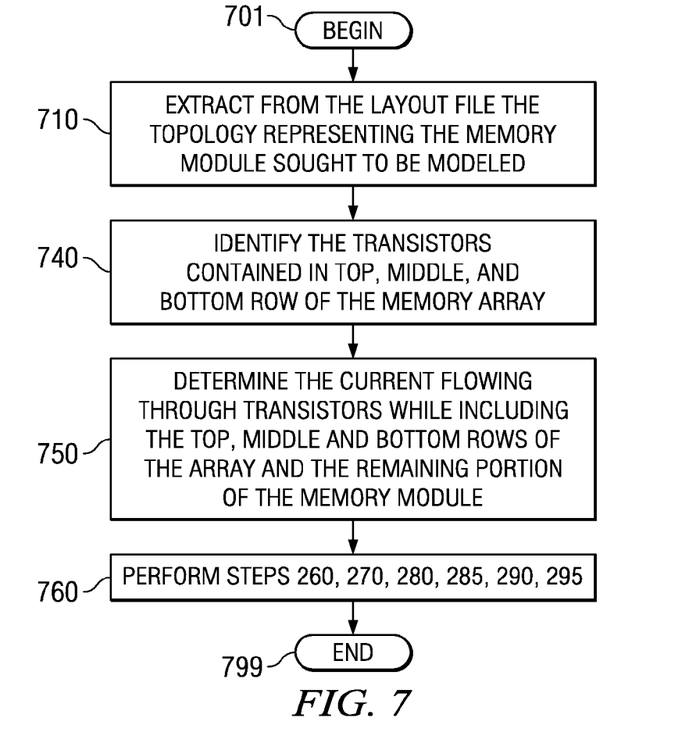
FIG. 7 is a flow-chart illustrating the manner in which a memory module may be modeled according to an aspect of the present invention.

FIG. 7 is a flow-chart illustrating the manner in which a memory module may be modeled according to an aspect of the present invention. For conciseness, only the differences from the flow-chart of FIG. 2 are included in FIG. 7. The method begins in step 701, in which control is immediately transferred to step 710.

In step 710, the topology (including transistors, resistors, etc., and the interconnections) representing the memory module sought to be modeled, is extracted using a suitable approach. In step 740, the portion of the topology representing the top, middle and bottom rows of the memory array are identified. In general, the determination of the rows depends on the format of representation of the input data (representing the module). An example approach for such a determination is described in a section below.

In step 750, the current flowing through each transistor, while including only the top, middle and bottom rows of array 610 and the remaining portion (620, 630, 650, etc.) of the memory module, is determined. Approaches similar to those described above with reference to FIGS. 4, 5A and 5B, may be used for determining the current flowing through each transistor.

Once the (approximate) current flowing through each transistor is determined, steps 260, 270, 285 and 290 may be performed based on the data representing the memory module (but with only the three rows of the memory array considered). Thus, the memory module may be rejected if any EM or voltage drop violations are detected.

It should be understood that top, bottom and middle rows represent a subset of rows of the memory array, and the number of computations may be reduced by having such a small subset (instead of all the rows) of the rows. The approach of FIG. 7 is based on an assumption that one of the three rows would represent close to the worst case scenario (in terms of violations).

The accuracy of the analysis may be enhanced by performing three iteration, with each of the top, middle and bottom rows being used in a corresponding one of the iterations. Such an analysis reflects the fact that a single row is accessed each time. However, the number of computations is increased due to such an approach.

However, as noted above, it is desirable to determine (portion of the circuit topology representing) the top, bottom and middle rows of the memory array. Such a determination needs to be performed by examining a layout file if the higher level design is not available. The manner in which the rows can be determined is described below.

IV. E. Determining Top, Bottom and Middle Rows of Memory Array

In an embodiment, a special layer (often referred to as SRAM layer in the case of SRAMs) contains information indicating the transistors ("bit row transistors") which form bit rows (of array 610). All bit rows transistors with unique model name are extracted in spice netlist by examining the special layer. The gate location (in term of X and Y dimensions) for each bit row transistor is also extracted by examining the file. Transistors forming the decoder and sense amplifier transistors are also extracted with different unique model names in the spice netlist.

The coordinates of the area in which the transistors related to array 610 are then determined. For illustration it is assumed that the lower left coordinates of memory array 610 equal (Xmin, Ymin) and the top right coordinates of memory array 610 equal (Xmax, Ymax). Xmin and Xmax may be determined by sorting/comparing the values for X-dimensions (of the bit row transistors). Ymin and Ymax may be determined similarly from the values for Y-dimensions.

Another parameter, bit row height (H) may be determined based on the process technology and other technology parameters used in the design/manufacture of memory array 610. The top, middle and bottom row can then the determined using Xmin, Ymin, Xmax, Ymax (in general, boundary coordinates) and H, as described below in further detail.

The top row is formed by the transistors with the gate terminals in a band formed by coordinates of (Xmax, Ymax−H) and (Xmax, Ymax) respectively. The bottom row is formed by the transistors with the gate terminals in a band formed by coordinates of (Xmin, Ymin+H) and (Xmin, Ymin) respectively. The middle row is formed by the transistors with the gate terminals in a band formed by coordinates of (Xmid, Ymid−H/2) and (Xmid, Ymid+H/2) respectively, wherein mid equals (maximum+minimum)/2.

The three rows thus determined are used in step 750 to model memory modules, as described above. The description is continued with reference to analysis of efuse blocks.

V. Modeling Efuse Blocks

V. A. General Introduction

As noted above, each efuse block contains several efuse cells. Each efuse cell generally contains a (metal) wire due to which the efuse cell is in a 'close' state offering minimal resistance (close to 0). By application of appropriate voltage level across an efuse cell, the wire can be blown (programmed) to operate in a 'open'(ideally infinite resistance) state. A efuse cell may be viewed as being programmed to one bit value in one state, and at the other bit value in the other state. By blowing the fuse (wire), the bit value can be changed from the value corresponding to the close state to the value corresponding to the open state.

Thus it is generally desirable that a circuit design be analyzed to ensure that an appropriate voltage level can be applied across efuse cells. Accordingly, it is desirable to determine the IR drop from a supply voltage to the nodes at which the efuse cells are connected. Based on the IR drop, a designer may ensure that desired voltage levels can be applied to program specific efuse cells.

It may be desirable to perform both a block level analysis as well as chip level analysis, and ensure that such voltages can be applied in both scenarios. Such analysis may need to be performed while balancing the accuracy and computational resource requirements, as noted above.

V. B. Method of Modeling Efuse Cells

Figure 8:
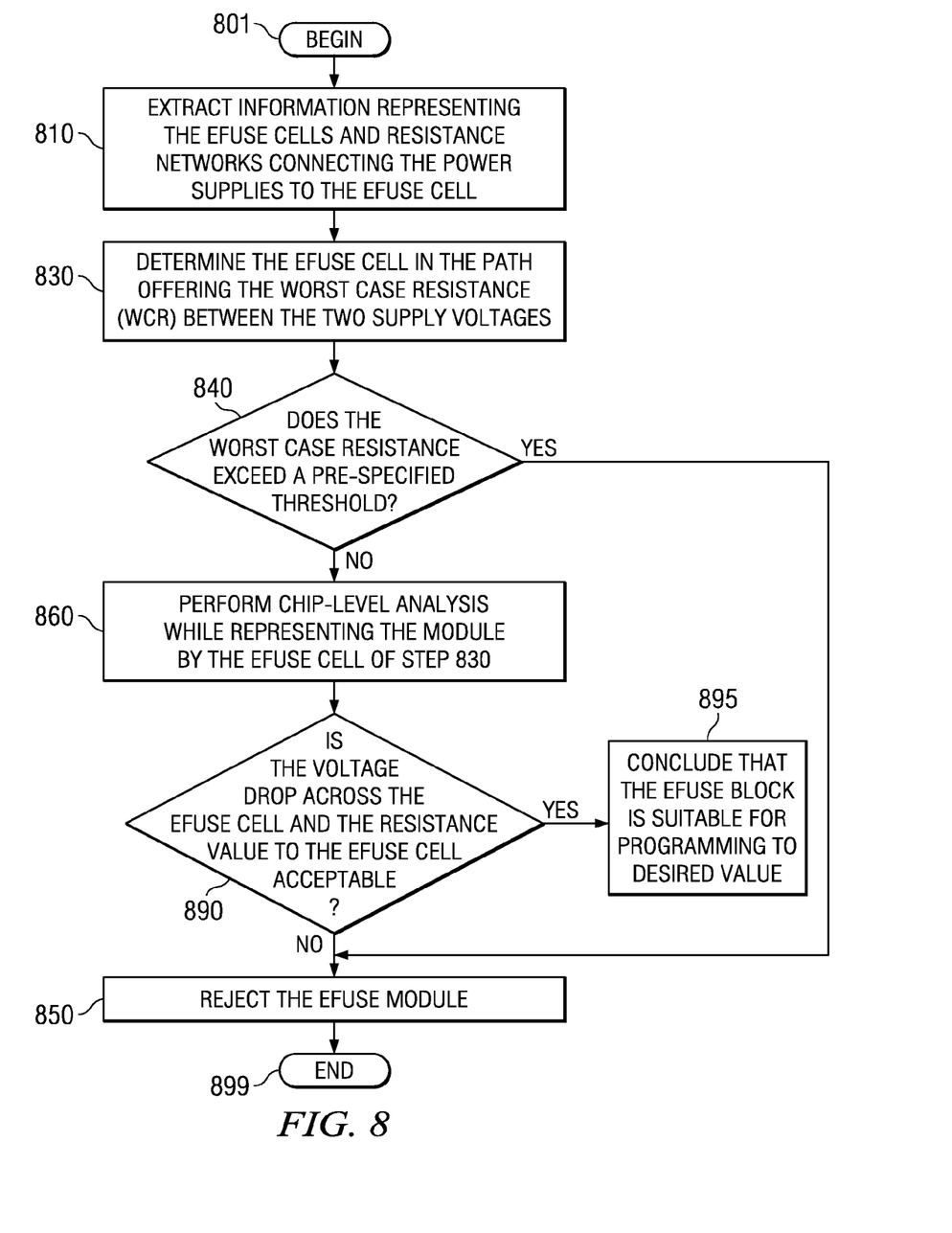
FIG. 8 is a flow-chart illustrating the details of modeling an efuse block according to an aspect of the present invention.

FIG. 8 is a flow-chart illustrating the details of modeling an efuse block according to an aspect of the present invention. The method begins in step 801, in which control is immediately transferred to step 810.

In step 810, information representing the efuse cells and resistance networks (i.e., parasitic resistance, resistors, etc.) connecting the power supplies to the efuse cell, is extracted from the data representing a circuit design. In an embodiment, the information is extracted from a layout file.

In step 830, an efuse cell (WCR cell) in the path offering the worst case resistance (WCR) between the two supply voltages is determined. An example approach to determining the WCR cell is described below.

In step 840, a determination is made as to whether the WCR value exceeds a pre-specified threshold. In an embodiment, the pre-specified threshold is set to a value of 8 Ohms, corresponding to a voltage level of 1.2 V desired for programming an efuse cell.

Control passes to step 850 if the WCR value exceeds the pre-specified threshold, otherwise to step 860. In step 850, the module is rejected as not being suitable for programming. The module (or resistance network) may be redesigned to avoid the violations.

In step 860, chip-level analysis is performed while representing the module by the WCR efuse cell. The computational requirements may be substantially reduced due to the use of a single cell in place of the entire module in the chip level analysis. An example approach by which chip-level analysis is performed is described below in further detail.

In step 890, a determination is made as to whether the voltage drop across the WCR efuse cell and the resistance of the path to the efuse cell are acceptable based on the analysis of step 860. Control passes step 895 if the voltage drop and the resistance value are determined to be acceptable, otherwise to step 850. In step 895, a conclusion is made that the entire efuse block is suitable for programming to desired values. The method then ends in step 899.

Due to representation of the entire module as the WCR efuse, the total number of computations required to implement the flow chart of FIG. 8 may be greatly reduced. In addition, it should be appreciated that the module may be represented by a few cells offering high resistance values.

The description is continued with reference to determining the WCR efuse cell noted above in step 830.

V. C. Determining the WCR Efuse Cell

Figure 9:
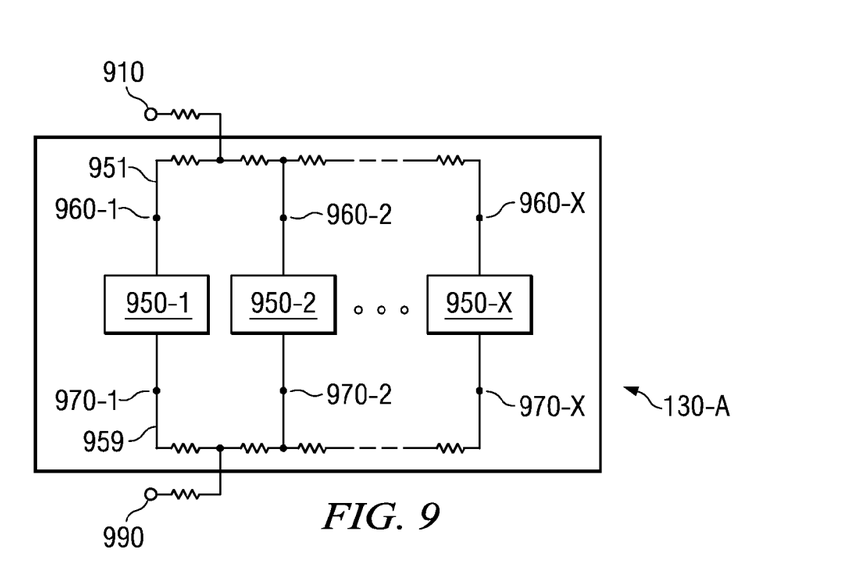
FIG. 9 is a circuit diagram of an embodiment of an eFuse block containing multiple efuse cells.

FIG. 9 is a circuit diagram of an embodiment of eFuse block 130-A used to illustrate the manner in which a WCR efuse cell may be determined. The eFuse block is shown containing eFuses 950-1 through 950-X connected between respective pairs of nodes {960-1 and 970-1} through {960-X and 970-X}.

Nodes 960-1 through 960-X are all connected to node 910, which is a point on a positive polarity of program supply voltage (Vpp) route/rail. Similarly, nodes 970-1 through 970-X are all connected to node 990, which is a point on the other polarity of program supply voltage (Vss) route/rail. The manner in which a WCR efuse cell may be determined is described below with reference to FIG. 10.

Figure 10:
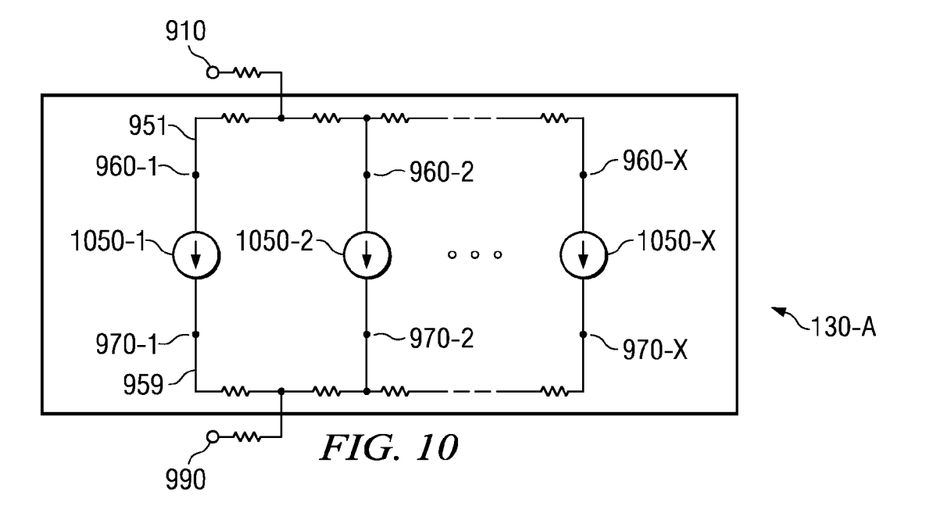
FIG. 10 is a circuit diagram illustrating the manner in which a WCR efuse cell connected between the two supply voltages (Vpp and Vss) may be determined.

FIG. 10 is a circuit diagram illustrating the manner in which a WCR efuse cell (the cell in the path offering the worst case resistance) between the two supply voltages (Vpp and Vss). In comparison to FIG. 9, each efuse cell 950-1 through 950-X is shown respectively replaced by current sources 1050-1 through 1050-X, for example, of unit magnitude (e.g., 1 milliampere). Using a unit magnitude current source simplifies the computation of resistance offered by each efuse cell.

The IR drop of a path equals product of current (I) through the path and the resistance (R) of the path. The equivalent resistance (R) of each path may be determined by dividing the difference in voltage at the two nodes of the path by current flowing through the path. As the current value is assumed to equal 1 unit, the IR drop equals difference in voltage at the two nodes. The manner in which such a determination can be made is described below.

Only the determination of resistance of the path via eFuse cell 950-1 is described for conciseness. Assuming voltage levels of V910 and V990 are respectively applied at nodes 910 and 990, the voltage levels V960-1 and V970-1 at nodes 960-1 and 970-1 may be determined by using tools such as simulators (e.g., SPICE) commercially available in the market place.

Effective resistance R951 (of path between nodes 960-1 and 910) and effective resistance R959 (of path between nodes 970-1 and 990) is determined respectively as shown in Equations (8) and (9) below.

$$R951 = V910 - V960\text{-}1 \quad \text{Equation (8)}$$

$$R959 = V990 - V970\text{-}1 \quad \text{Equation (9)}$$

The total resistance R950-1 between the two power points 910 and 990 via efuse cell 950-1 equals (R951+R959). Similarly, the resistance to nodes of efuse cells 950-2 through 950-X may respectively equal R950-2 through R950-X. The worst case resistance (WCR) equals the maximum of {R950-1, R950-2, . . . , R950-X}. The efuse cell associated with the WCR is determined to be the WCR efuse cell.

V. D. Chip Level Analysis

While performing chip-level analysis, each module is replaced by a corresponding (single) WCR efuse cell determined as described above. The effective resistance of the path from a pre-determined point (e.g., from the supply voltage source) of the chip to (the terminal of) each WCR efuse cell is determined by replacing each WCR efuse cell with a current source of known magnitude similar to above described approach (in determining the WCR cell).

Also, drop in the voltage (compared to voltage provided at pre-determined points, for example, supply points at chip level) at each WCR efuse cell may be determined by replacing each WCR efuse cell (representing a corresponding module) by a current source (Isense). The value/magnitude of the current source equals the higher current rating in the blown and unblown states of each eFuse cell, and is given for a particular technology (used to fabricate the eFuse module) and other technological considerations. The value may be provided associated with each efuse module.

A module is rejected if the voltage drop or resistance value to a corresponding WCR efuse cell (of a module) violates the respective voltage and resistance threshold values. Such an approach minimizes the number of computations as number of WCR efuse cells analyzed at the chip-level is substantially less compared to the total number of efuse cells in each module. The description is continued with respect to modeling of output pins of an integrated circuit.

VI. Modeling Output Paths

VI. A. General Introduction

It is often desired to determine whether the current flowing through each output path is within the corresponding threshold values at least to ensure that the electro migration (EM) is within an acceptable range. Current flowing through interconnects and thus EM can vary depending on various factors such as frequency of operation, slew (rate/slope of rise/fall) of the output signal, and loads driven.

As noted above, excessive EM leads to reduced life-span of the paths/components and excessive current density/flow is thus undesirable. In addition, when only layout files are available for a module, convention tools which operate on high level logic may be inadequate in characterizing the current flow.

Alternatively, the EM at different operating conditions (frequency, slew, load, etc.) of interest may be determined by dynamic transistor level simulation. Unfortunately, such an approach may consume substantial computational resources/time, and may therefore be unacceptable at least in some environments. An aspect of the present invention enables the output paths to be modeled, as described below.

VI. B. Modeling Output Paths

Figure 11:
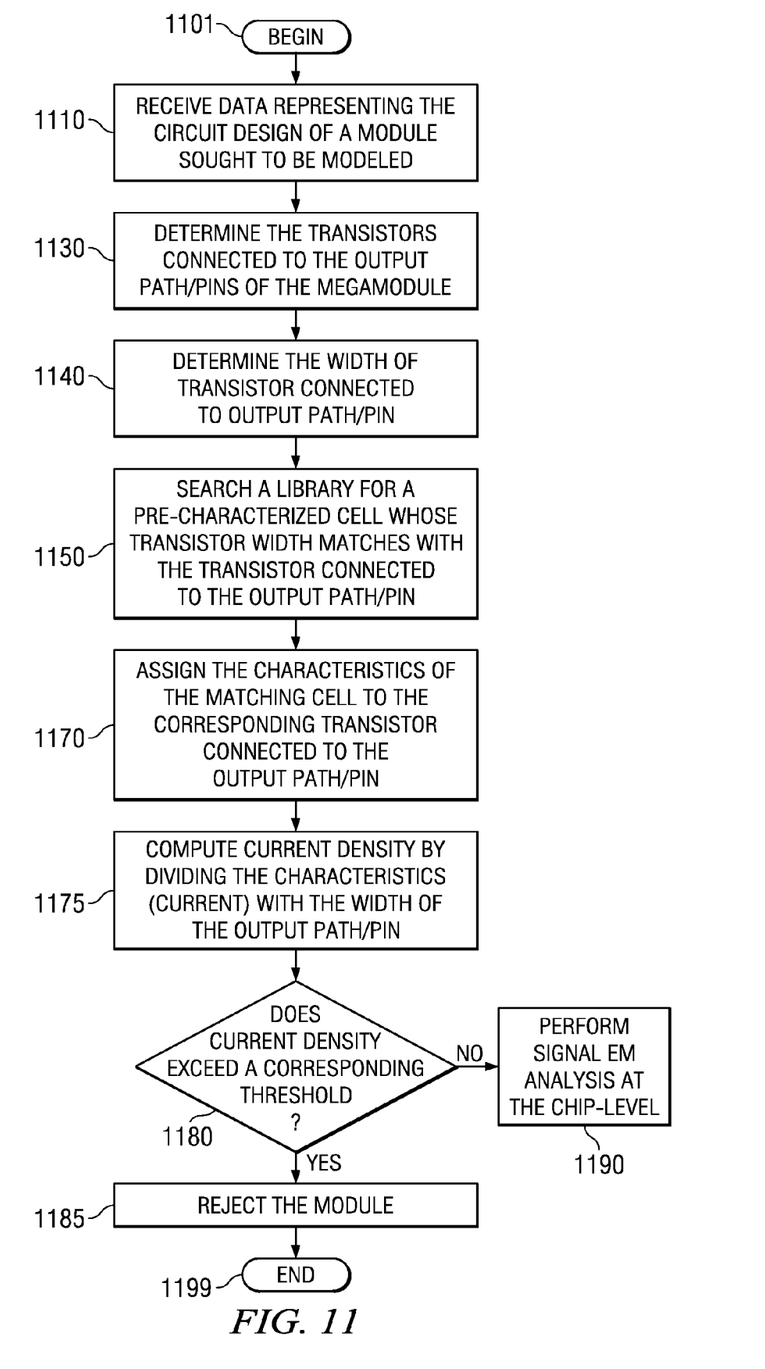
FIG. 11 is a flow-chart illustrating the manner in which an output pin/path can be modeled according to an aspect of the present invention.

FIG. 11 is a flow-chart illustrating the manner in which current driven by each transistor (via output path) may be determined according to an aspect of the present invention. For illustration, the flow-chart is described with reference to megamodule 110 of FIG. 4A-4C. However, the approach(es) may be used to determine the current flowing through output paths driven by transistors in other modules (for other reasons) as well. The method begins in step 1101, in which control immediately passes to step 1110.

In step 1110, data representing the circuit design of a module containing an output path sought to be modeled may be received. In step 1130, the transistors driving the output paths are determined by examining the data. The determination generally depends on the manner in which the IC design is represented. In an embodiment, the data is received in the form of a layout file and only the transistors are considered for further analysis.

In step 1140, the width of the transistors of step 1130 is determined. For example, while modeling current density on path 113, the width (W480) of transistor 480 (driving a current on path 113) is determined.

In step 1150, a library is searched for a pre-characterized cell whose transistor width matches (substantially equals) with the transistor connected to the output path/pin. In general, transistors in the pre-characterized cell with widths substantially equaling the width of transistor 480 may be determined. Libraries (containing pre-characterized cells) are often maintained by designers to quickly design a circuit for various manufacturing processes, frequencies, etc.

In step 1170, the characteristics of the matching cell are assigned to the corresponding transistor connected to the output path. The current flowing through the output path is deemed to be characterized by parameters (average, RMS, and peak currents) of the matching transistor.

In step 1175, the current density (of output path/pin) may be computed by dividing the characteristics (current) of the pre-characterized cell by the width of the output path/pin.

In step 1180, whether the current density on the path driven by a transistor exceeds a corresponding threshold is determined. Control passes to step 1185 if the current density exceeds the threshold, and to step 1190 otherwise. In step 1185, the module is rejected and control passes to step 1199, in which the method ends.

In step 1190, chip-level analysis (of entire IC) is performed taking into account the assigned characteristics. That is, current density on the output path is computed based on the parameters associated with the matching transistors. Control again passes to step 1180, in which any violations at the chip-level are determined.

As the current density is determined substantially by the transistor driving the output path, the current characteristics may be computed with acceptable accuracy using the approach of FIG. 11. In addition, due to the approach of FIG. 11, the approximation may be performed using a reduced number of computations. Thus, the characteristics of the transistor connected to the output path may be determined and then be used while performing chip-level analysis.

The description is continued with reference to the digital processing system implemented substantially in the form of a software, which provides several features according to an aspect of the present invention.

VII. Computer System

Figure 12:
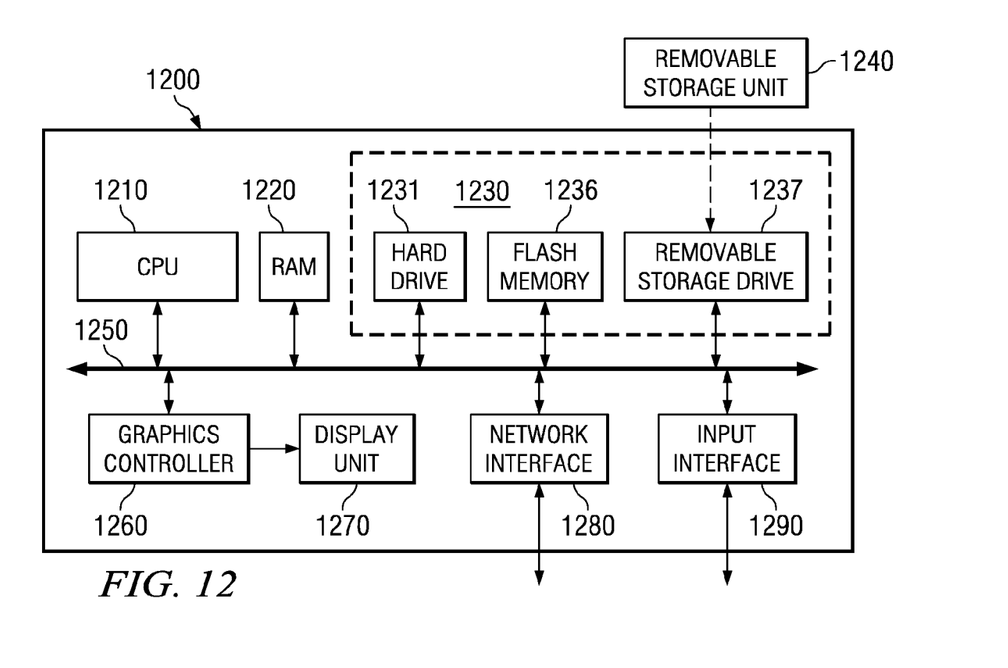
FIG. 12 is a block diagram of a computer system illustrating an example system for implementing the present invention.

FIG. 12 is a block diagram of computer system 1200 illustrating an example system for implementing the present invention. Computer system 1200 may contain one or more processors such as central processing unit (CPU) 1210, random access memory (RAM) 1220, secondary memory 1230, graphics controller 1260, display unit 1270, network interface 1280, and input interface 1290. All the components except display unit 1270 may communicate with each other over communication path 1250, which may contain several buses as is well known in the relevant arts. The components of FIG. 12 are described below in further detail.

CPU 1210 may execute instructions stored in RAM 1220 to provide several features of the present invention (by performing tasks corresponding to various approaches described above). CPU 1210 may contain multiple processing units, with each processing unit potentially being designed for a specific task. Alternatively, CPU 1210 may contain only a single processing unit. RAM 1220 may receive instructions from secondary memory 1230 using communication path 1250. Data representing the model of the modules and the determined EM and IR drop parameters corresponding to each path may be stored in and retrieved from secondary memory 1230 (and/or RAM 1220) during the execution of the instructions.

Graphics controller 1260 generates display signals (e.g., in RGB format) to display unit 1270 based on data/instructions received from CPU 1210. Display unit 1270 contains a display screen to display the images defined by the display signals. Input interface 1290 may correspond to a key_board and/or mouse, and generally enables a user to provide inputs. Network interface 1280 enables some of the inputs (and outputs) to be provided on a network. In general, display unit 1270, input interface 1290 and network interface 1280 enable a user to analyze (e.g., signal EM) of output pins in integrated circuits using cell libraries stored in secondary memory 1230 (or received from network interface 1280), and may be implemented in a known way.

Secondary memory 1230 may contain hard drive 1231, flash memory 1236 and removable storage drive 1237. Secondary storage 1230 may store the software instructions (which perform the actions specified by various flow charts above) and data (e.g., topology of the modules, cell libraries and determined EM and IR drop values corresponding to each path), which enable computer system 1200 to provide several features in accordance with the present invention. Some or all of the data and instructions may be provided on removable storage unit 1240, and the data and instructions may be read and provided by removable storage drive 1237 to CPU 1210. Floppy drive, magnetic tape drive, CD_ROM drive, DVD Drive, Flash memory, removable memory chip (PCMCIA Card, EPROM) are examples of such removable storage drive 1237.

Removable storage unit 1240 may be implemented using medium and storage format compatible with removable storage drive 1237 such that removable storage drive 1237 can read the data and instructions. Thus, removable storage unit 1240 includes a computer readable storage medium having stored therein computer software and/or data. An embodiment of the present invention is implemented using software running (that is, executing) in computer system 1200.

In this document, the term "computer program product" is used to generally refer to removable storage unit 1240 or hard disk installed in hard drive 1231. These computer program products are means for providing software to computer system 1200. As noted above, CPU 1210 may retrieve the software instructions, and execute the instructions to provide various features of the present invention.

CONCLUSION

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

The invention claimed is:

1. A method of determining approximately whether a design of a module violates a desired criteria, said design being represented in a form of a data, said method comprising:

examining said data to extract a topology of said design, wherein said topology comprises a plurality of transistors, a plurality of resistors, and a plurality of paths connecting said plurality of resistors and said plurality of transistors;

generating a model of said module by replacing each of said plurality of transistors in said topology by a corresponding one of a plurality of current sources;

computing a magnitude of each of said plurality of current sources by distributing an aggregate amount of current sunk by said module among said plurality of current sources, wherein said magnitude of each current source is treated proportionate to a corresponding width of the transistors by said computing; and analyzing said model to determine a corresponding current on each of said plurality of paths, wherein a determination is made as to whether said design violates said desired criteria based on said corresponding current.

2. The method of claim 1, wherein said desired criteria comprises ensuring that a current density on each of said plurality of paths does not exceed a corresponding maximum value, said method further comprising determining whether said corresponding current on each of said plurality of paths corresponds to a current density exceeding said corresponding maximum value.

3. The method of claim 2, wherein said desired criteria further comprises ensuring that a voltage drop from a supply voltage to a first node contained in said module is within a corresponding threshold value.

4. The method of claim 3, wherein said computing comprises treating said plurality of transistors to be connected in parallel irrespective of said topology of said design.

5. The method of claim 3, further comprises rejecting said module if either of said criteria is violated.

6. The method of claim 5, wherein said module is comprised in an integrated circuit, said method further comprising performing a chip-level analysis of said integrated circuit, wherein said module is substituted by said model.

7. The method of claim 6, wherein said analyzing of said model is performed using a simulation tool.

8. The method of claim 3, wherein said data representing said design is provided in a form of a layout file.

9. The method of claim 1, wherein said module comprises a memory module containing a memory array, said memory containing a plurality of rows, wherein said topology comprises only a subset of rows of said memory array.

10. The method of claim 9, wherein said subset of rows comprises a top row, a bottom row and a middle row.

11. The method of claim 10, further comprising determining said top row, said bottom row and said middle row from a layout file representing said memory module, wherein said determining from said layout file comprises:

examining a special layer of said layout file to determine a coordinate of a gate location of each of a plurality of transistors contained in a memory array of said memory module;

determining boundary coordinates of said memory array based on said coordinates of said gate locations; and determining a set of transistors in each of said top row, said bottom row and said middle row according to said boundary coordinates and a height of each of bit cell contained in said memory array.

12. The method of claim 9, wherein said generating, said computing and said analyzing are performed in a plurality of iterations, wherein a top row of said topology comprises only a top row of said memory array in a first iteration, a middle row of said topology in a second iteration and a bottom row of said memory array in a third iteration.

13. A computer readable medium carrying one or more sequences of instructions for causing a system to determine approximately whether a design of a module violates a desired criteria, said design being represented in a form of a data, wherein execution of said one or more sequences of instructions by one or more processors contained in said system causes said one or more processors to perform the actions of:

examining said data to extract a topology of said design, wherein said topology comprises a plurality of transistors, a plurality of resistors, and a plurality of paths connecting said plurality of resistors and said plurality of transistors;

generating a model of said module by replacing each of said plurality of transistors in said topology by a corresponding one of a plurality of current sources;

computing a magnitude of each of said plurality of current sources by distributing an aggregate amount of current sunk by said module among said plurality of current sources, wherein said magnitude of each current source is treated proportionate to a corresponding width of the transistors by said computing; and analyzing said model to determine a corresponding current on each of said plurality of paths, wherein a determination is made as to whether said design violates said desired criteria based on said corresponding current.

14. The computer readable medium of claim 13, wherein said desired criteria comprises ensuring that a current density on each of said plurality of paths does not exceed a corresponding maximum value, said actions further comprising determining whether said corresponding current on each of said plurality of paths corresponds to a current density exceeding said corresponding maximum value.

15. The computer readable medium of claim 14, wherein said desired criteria further comprises ensuring that a voltage drop from a supply voltage to a first node contained in said module is within a corresponding threshold value.

16. The computer readable medium of claim 15, wherein said computing comprises treating said plurality of transistors to be connected in parallel irrespective of said topology of said design.

17. The computer readable medium of claim 15, said actions further comprise rejecting said module if either of said criteria is violated.

18. The computer readable medium of claim 17, wherein said module is comprised in an integrated circuit, and said actions further comprising performing a chip-level analysis of said integrated circuit, wherein said module is substituted by said model.

19. The computer readable medium of claim 18, wherein said analyzing of said model is performed using a simulation tool.

20. The computer readable medium of claim 15, wherein said data representing said design is provided in a form of a layout file.

21. The computer readable medium of claim 13, wherein said module comprises a memory module containing a memory array, said memory containing a plurality of rows, wherein said topology comprises only a subset of rows of said memory array.

22. The computer readable medium of claim 21, wherein said subset of rows comprises a top row, a bottom row and a middle row.

23. The computer readable medium of claim 22, said actions further comprising determining said top row, said bottom row and said middle row from a layout file representing said memory module, wherein said determining from said layout file comprises:

examining a special layer of said layout file to determine a coordinate of a gate location of each of a plurality of transistors contained in a memory array of said memory module;

determining boundary coordinates of said memory array based on said coordinates of said gate locations; and determining a set of transistors in each of said top row, said bottom row and said middle row according to said boundary coordinates and a height of each of bit cell contained in said memory array.

24. The computer readable medium of claim 21, wherein said generating, said computing and said analyzing are performed in a plurality iterations, wherein a top row of said topology comprises only a top row of said memory array in a first iteration, a middle row of said topology in a second iteration and a bottom row of said memory array in a third iteration.

* * * * *